«12» United States Patent
Jiang et al.

US009269885B2

«10» Patent No.: US 9,269,885 B2
«45» Date of Patent: Feb. 23, 2016

«54» METHOD AND LOCALIZED HAPTIC RESPONSE SYSTEM PROVIDED ON AN INTERIOR-FACING SURFACE OF A HOUSING OF AN ELECTRONIC DEVICE

«71» Applicant: Novasentis, Inc., Burlingame, CA (US)

«72» Inventors: Li Jiang, Union City, CA (US); Brian Zellers, Bellefonte, PA (US); Christophe Ramstein, San Francisco, CA (US)

«73» Assignee: Novasentis, Inc., State College, PA (US)

«*» Notice: Subject to any disclaimer, the term of this patent is extended or adjusted under 35 U.S.C. 154(b) by 0 days.

«21» Appl. No.: 14/148,537

«22» Filed: Jan. 6, 2014

«65» Prior Publication Data

US 2014/0191997 A1     Jul. 10, 2014

Related U.S. Application Data

«60» Provisional application No. 61/749,723, filed on Jan. 7, 2013.

«51» Int. Cl.
*G06F 3/041* (2006.01)
*H01L 41/09* (2006.01)
(Continued)

«52» U.S. Cl.
CPC .......... *H01L 41/0973* (2013.01); *B06B 1/06* (2013.01); *B06B 3/00* (2013.01); *G06F 3/016* (2013.01); *G10K 9/22* (2013.01); *H01L 41/193* (2013.01); *H04M 1/0202* (2013.01)

«58» Field of Classification Search
CPC .......... G06F 3/016; G06F 2203/04103; G06F 3/041; G06F 3/0414; G06F 3/0412; G06F 1/1626; G06F 3/04883; G06F 1/13338; H01L 41/0926; H01L 41/09; H01L 41/1132; B06B 1/06; B06B 3/00; A61M 25/0158; F04B 43/046; G10K 9/22; H03K 17/9643; H03K 2217/96062; H04M 1/0202; H04M 2250/22; H04R 17/005; H04R 17/025; H04R 2400/03; H04R 2499/11

USPC .................................................. 345/173-178
See application file for complete search history.

«56» References Cited

U.S. PATENT DOCUMENTS 5,263,876 A    11/1993   Johnescu et al.
5,350,966 A     9/1994   Culp
(Continued)

FOREIGN PATENT DOCUMENTS

EP        1544720 A1     6/2005
JP      2010283926 A    12/2010
(Continued)

OTHER PUBLICATIONS

International Search Report and Written Opinion of the International Searching Authority for PCT/US2013/053594, date of mailing Dec. 23, 2013, 9 pages.
(Continued)

*Primary Examiner* — Aneeta Yodichkas
*Assistant Examiner* — Gerald Oliver
«74» *Attorney, Agent, or Firm* — Edward C. Kwok; Hogan Lovells US LLP

«57» ABSTRACT

A housing for an electronic device allows a haptic feedback response that is localized to a specific area on a back panel of the housing of the electronic device. For example, a user holding the mobile electronic device may directly receive haptic feedback in his/her fingers that are supporting the back side of the mobile electronic device. Those specific areas on the back panel may be locations where the panel material is thinned, or locations where the panel material has been removed and replaced by a suitably selected membrane material having favorable mechanical properties. The membrane material may be introduced as an embossment of a membrane layer. In addition, a force-sensing resistor type material may be used as a replacement material, so as to sense the pressure of a user's finger pressing on the embossed structure at the specific locations to which EMP actuators are bonded.

20 Claims, 2 Drawing Sheets

MECHANICAL DIAGRAM OF THINNED HOUSING

(51) Int. Cl.

| | | |
|---|---|---|
| G06F 3/01 | (2006.01) | |
| H04M 1/02 | (2006.01) | |
| B06B 1/06 | (2006.01) | |
| H01L 41/193 | (2006.01) | |
| B06B 3/00 | (2006.01) | |
| G10K 9/22 | (2006.01) | |

(56) References Cited

U.S. PATENT DOCUMENTS

| | | | |
|---|---|---|---|
| 5,519,278 | A | 5/1996 | Kahn et al. |
| 6,376,971 | B1 | 4/2002 | Pelrine et al. |
| 6,423,412 | B1 | 7/2002 | Zhang et al. |
| 6,605,246 | B2 | 8/2003 | Zhang et al. |
| 6,703,257 | B2 | 3/2004 | Takeuchi et al. |
| 6,787,238 | B2 | 9/2004 | Zhang et al. |
| 6,809,462 | B2 | 10/2004 | Pelrine et al. |
| 6,877,325 | B1 | 4/2005 | Lawless |
| 6,888,291 | B2 | 5/2005 | Arbogast et al. |
| 7,038,357 | B2 | 5/2006 | Goldenberg et al. |
| 7,339,572 | B2 | 3/2008 | Schena |
| 7,368,862 | B2 | 5/2008 | Pelrine et al. |
| 7,567,681 | B2 | 7/2009 | Pelrine et al. |
| 7,952,261 | B2 | 5/2011 | Lipton et al. |
| 7,971,850 | B2 | 7/2011 | Heim et al. |
| 8,222,799 | B2 | 7/2012 | Polyakov et al. |
| 8,362,882 | B2 | 1/2013 | Heubel et al. |
| 8,385,060 | B2 | 2/2013 | Dabov et al. |
| 8,390,594 | B2 | 3/2013 | Modarres et al. |
| 2003/0003962 | A1 | 1/2003 | Vooi-Kia et al. |
| 2007/0200467 | A1 | 8/2007 | Heydt et al. |
| 2008/0100568 | A1* | 5/2008 | Koch et al. .................. 345/156 |
| 2009/0002205 | A1 | 1/2009 | Klinghult et al. |
| 2009/0167507 | A1 | 7/2009 | Maenpaa |
| 2010/0079264 | A1 | 4/2010 | Hoellwarth |
| 2010/0090813 | A1 | 4/2010 | Je et al. |
| 2010/0316242 | A1 | 12/2010 | Cohen et al. |
| 2011/0038625 | A1 | 2/2011 | Zellers et al. |
| 2011/0116171 | A1 | 5/2011 | Kwon et al. |
| 2011/0133598 | A1 | 6/2011 | Jenninger et al. |
| 2011/0290686 | A1 | 12/2011 | Huang |
| 2012/0105333 | A1 | 5/2012 | Maschmeyer et al. |
| 2012/0126663 | A1 | 5/2012 | Jenninger et al. |
| 2012/0126959 | A1 | 5/2012 | Zarrabi et al. |
| 2012/0128960 | A1 | 5/2012 | Büsgen et al. |
| 2012/0139393 | A1 | 6/2012 | Choi et al. |
| 2012/0178880 | A1 | 7/2012 | Zhang et al. |
| 2012/0194448 | A1 | 8/2012 | Rothkopf |
| 2012/0206248 | A1 | 8/2012 | Biggs |
| 2012/0223880 | A1 | 9/2012 | Birnbaum et al. |
| 2013/0207793 | A1 | 8/2013 | Weaber et al. |
| 2014/0035735 | A1 | 2/2014 | Zellers et al. |
| 2014/0085065 | A1 | 3/2014 | Biggs et al. |
| 2014/0090424 | A1 | 4/2014 | Charbonneau et al. |
| 2014/0139328 | A1 | 5/2014 | Zellers et al. |
| 2014/0139329 | A1 | 5/2014 | Ramstein et al. |
| 2014/0139436 | A1 | 5/2014 | Ramstein et al. |
| 2014/0140551 | A1 | 5/2014 | Ramstein |
| 2014/0191973 | A1 | 7/2014 | Zellers et al. |
| 2014/0368440 | A1* | 12/2014 | Polyakov et al. ............. 345/173 |

FOREIGN PATENT DOCUMENTS

| | | |
|---|---|---|
| JP | 2011172339 A | 9/2011 |
| JP | 2012134998 A | 7/2012 |
| KR | 20060107259 A | 10/2006 |
| KR | 20110110212 A | 10/2011 |
| KR | 20120013273 A | 2/2012 |
| KR | 20120063318 A | 6/2012 |
| KR | 20120078529 A | 7/2012 |
| KR | 20120105785 A | 9/2012 |
| WO | 2008054959 A1 | 5/2008 |
| WO | 2010085575 A1 | 7/2010 |
| WO | 2012063166 A1 | 5/2012 |

OTHER PUBLICATIONS

International Search Report and Written Opinion of the International Searching Authority for PCT/US2013/071085, date of mailing Mar. 17, 2014, 10 pages.

International Search Report and Written Opinion of the International Searching Authority for PCT/US2013/071072, date of mailing Mar. 13, 2014, 15 pages.

International Search Report and Written Opinion of the International Searching Authority for PCT/US2013/071075, date of mailing Mar. 20, 2014, 12 pages.

International Search Report and Written Opinion of the International Searching Authority for PCT/US2013/071078, date of mailing Mar. 28, 2014, 13 pages.

International Search Report and Written Opinion of the International Searching Authority for PCT/US2013/071062, date of mailing Apr. 28, 2014, 11 pages.

International Search Report and Written Opinion of the International Searching Authority for PCT/US2014/010373, date of mailing Apr. 8, 2014, 10 pages.

Matysek et al., Combined Driving and Sensing Circuitry for Dielectric Elastomer Actuators in mobile applications, from Electroactive Polymer Actuators and Devices (EAPAD) 2011, Proc. of SPIE vol. 7976, pp. 1-11.

Neese et al., Large Electrocaloric Effect in Ferroelectric Polymers Near Room Temperature, from Science, vol. 321, Aug. 8, 2008, pp. 821-823.

Zhang et al., Giant Electrostriction and Relaxor Ferroelectric Behavior in Electron-Irradiated Poly(vinylidene fluoride-trifluoroethylene) Copolymer, from Science, vol. 280, Jun. 26, 1998, pp. 2101-2104.

Xia et al., High Electromechanical Responses in a Poly(vinylidene fluoride-trifluoroethylene-chlorofluoroethylene) Terpolymer, online link to Advanced Materials, vol. 14, Issue 21, (http://onlinelibrary.wiley.com/doi/10.1002/1521-4095 (20021104)14:21<>1.0.CO;2-O/issuetoc), Nov. 2002, pp. 1574-1577.

PCT International Search Report and Written Opinion for International Application No. PCT/IB2013/003212 dated Oct. 15, 2014, 20 pages.

PCT International Preliminary Report on Patentability for International Application No. PCT/US2013/071072, dated May 26, 2015, 9 pages.

PCT International Preliminary Report on Patentability for International Application No. PCT/US2013/071075, dated May 26, 2015, 9 pages.

PCT International Preliminary Report on Patentability for International Application No. PCT/US2013/071078, dated May 26, 2015, 10 pages.

PCT International Preliminary Report on Patentability for International Application No. PCT/US2013/071085, dated May 26, 2015, 7 pages.

PCT International Preliminary Report on Patentability for International Application No. PCT/IB2013/003212, dated Jul. 7, 2015, 15 pages.

PCT International Preliminary Report on Patentability for International Application No. PCT/US2014/010373, dated Jul. 7, 2015, 7 pages.

* cited by examiner

PHYSICAL MODEL OF DEVICE HOUSING BACKSIDE

MECHANICAL DIAGRAM OF THINNED HOUSING

OPENINGS IN HOUSING BACKSIDE TO ACCOMODATE MEMBRANE INSERTS

MECHANICAL DIAGRAM OF THE MEMBRANE INSIDE

METHOD AND LOCALIZED HAPTIC RESPONSE SYSTEM PROVIDED ON AN INTERIOR-FACING SURFACE OF A HOUSING OF AN ELECTRONIC DEVICE

CROSS REFERENCE TO RELATED APPLICATIONS

The present application is related to and claims priority of U.S. provisional patent application ("Copending Provisional Patent Application"), Ser. No. 61/749,723, entitled "METHOD AND LOCALIZED HAPTIC RESPONSE SYSTEM PROVIDED ON AN INTERIOR-FACING SURFACE IN THE HOUSING OF A ELECTRONIC DEVICE," filed on Jan. 7, 2013. The present patent application is related to U.S. patent application ("Copending Application"), Ser. No. 13/683,963, filed Nov. 21, 2012, entitled "Localized Multimodal Electromechanical Polymer Transducers," and U.S. patent application ("Copending Application"), Ser. No. 13/683,980, entitled "Haptic System with Localized Response," filed Nov. 21, 2012. The disclosures of the Copending Provisional Application, and the Copending Applications are hereby incorporated by reference in its entirety.

BACKGROUND OF THE INVENTION

1. Field of the Invention

The present invention relates to multilayer electromechanical polymer (EMP) actuators, In particular, the present invention relates to multilayer EMP actuators in hand held electronic devices.

2. Discussion of the Related Art

New electromechanical materials have been incorporated in numerous electronic devices, especially in devices related to mobile computing. In this context, an electromechanical material is a material that provides either a mechanical response to an electrical excitation, or an electrical response to a mechanical excitation. In many instances, an electromechanical material can provide both types of responses. A device that takes advantage of such electromechanical properties is often referred to as a transducer. A transducer can be used as a mechanical actuator which delivers a mechanical response to an electrical excitation. Similarly, a transducer may be used as a mechanical sensor based on an electrical response to a mechanical stimulation.

SUMMARY

The present invention provides a housing for an electronic device which allows a haptic feedback response that is localized to a specific area on a back panel of the housing of the electronic device. For example, the present invention allows a user holding a mobile electronic device to directly receive haptic feedback in his/her fingers that are supporting the back side of the mobile electronic device. Those specific areas on the back panel may be locations where the panel material is thinned, or locations where the panel material has been removed and replaced by a suitably selected membrane material having favorable mechanical properties. The membrane material may be introduced as an embossment of a membrane layer. In addition, a force-sensing resistor type material may be used as a replacement material, so as to sense the pressure of a user's finger pressing on the embossed structure at the specific locations to which EMP actuators are bonded. The EMP actuators may create both audio and vibro-tactile signals when excited. The audio component gives the user an audible confirmation for a key that is pressed.

The present invention is better understood upon consideration of the detailed description below in conjunction with the drawings.

DETAILED DESCRIPTION OF THE PREFERRED EMBODIMENTS

According to one embodiment of the present invention, EMP actuators may be placed on an interior-facing surface of a housing for a mobile electronic device, such as the inside surface of a cover plate on the back side of the electronic device. The EMP actuators may be bonded, for example, to locations where the structural properties of the housing are such that a maximum amount of surface acceleration can take place when the EMP actuators are excited.

Figure 1:
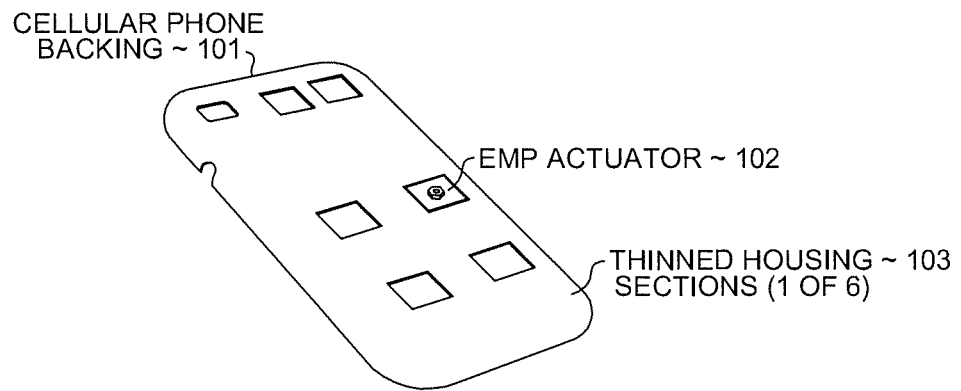
FIG. 1 shows physical model 101 that is based on a back cover of a cellular telephone on which EMP actuator 102 is bonded, in accordance with one embodiment of the present invention.

FIG. 1 shows physical model 101 that is based on a back cover of a cellular telephone, in accordance with one embodiment of the present invention. As shown in FIG. 1, physical model 101 represents a plate at the back cover of the housing of a cellular telephone with an interior-facing surface. EMP actuator 102 is bonded at one of six locations on the interior-facing surface at which backing material of physical model 101 has been thinned. Each of these locations is thinned to provide the greatest surface acceleration (i.e. vibration) output within the haptic band of interest, when the corresponding EMP actuator (e.g., EMP actuator 102) is excited. At each location where the backing material is thinned, the resulting vibration is designed to be local to vicinity of the location and can only be sensed by a human user placing a finger at that location.

Figure 2:
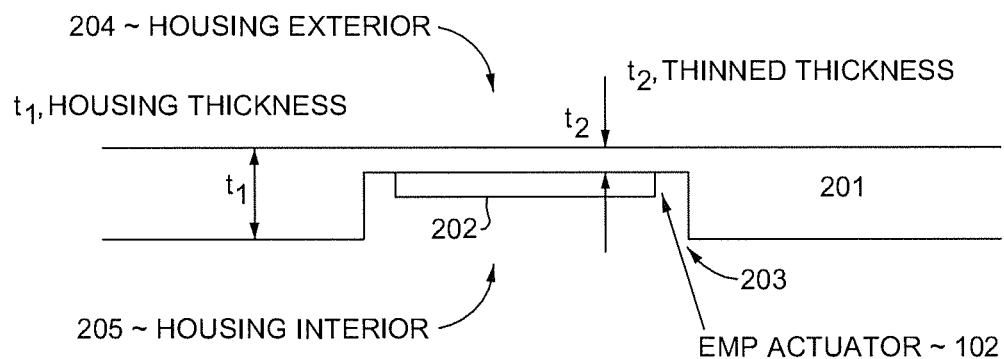
FIG. 2 shows in cross section the design of a thinned location of physical model 201, similar to physical model 101 of FIG. 1, in accordance with one embodiment of the present invention.

FIG. 2 shows in cross section a design of a thinned location of physical model 201, which has similar structural properties as physical model 101 of FIG. 1, in accordance with one embodiment of the present invention. FIG. 2 also illustrates the mechanics of the structure at the thinned location. As shown in FIG. 2, physical model 201, which has a thickness of $t_1$, generally, includes recessed location 203 where the backing material is thinned to a thickness $t_2$. As indicated by arrows 204 and 205, pointing to the exterior-facing and interior-facing sides of physical model 201, respectively, the cavity of recessed location 203 opens to the interior of the cellular telephone. EMP actuator 202 is bonded to the inside surface in the cavity at recessed location 203. The thickness $t_2$ is specifically selected such that EMP actuator 202 provides a pre-determined haptic response magnitude when EMP actuator 202 is excited under expected use conditions.

Figure 3:
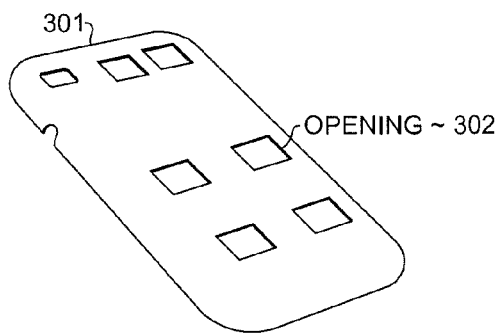
FIG. 3 shows model 301, which represents a back plate in the housing of a cellular telephone, having provided therein openings 302, according to one embodiment of the present invention.

According to a second embodiment of the present invention, rather than thinning the backing material of a housing of the cellular telephone at specific locations, the backing material may be completely removed from these specific locations and replaced by a thin membrane type material. The thin material serves as a wall covering for each of the resulting openings. FIG. 3 shows model 301, which represents a back plate in the housing of a cellular telephone, the back plate having been provided therein openings 302, according to one embodiment of the present invention. At each opening, where a haptic response is desired, a membrane is placed to cover the opening, thus replacing the removed backing material. The interior of the cellular telephone is thus protected from exposure to the elements.

Figure 4:
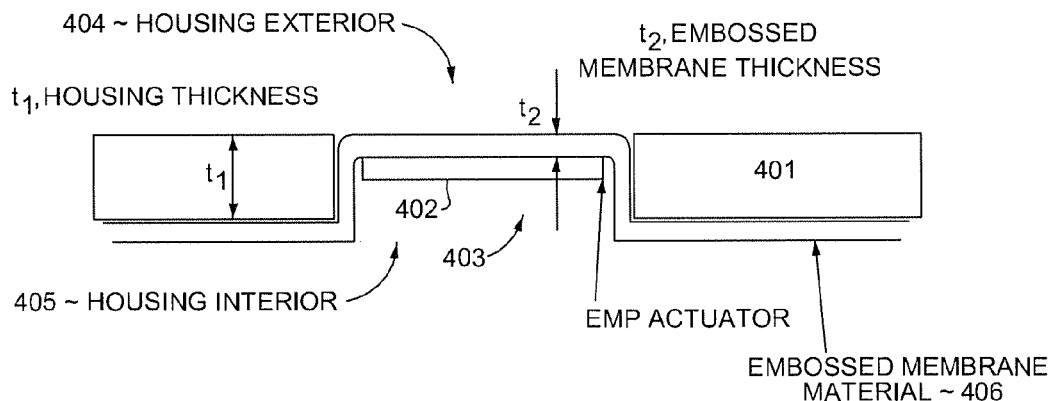
FIG. 4 shows in cross section the design of embossed location 403 in a membrane material provided in physical model 401, similar to physical model 301 of FIG. 3, in accordance with one embodiment of the present invention.

FIG. 4 shows in cross section the design of embossed location 403 in a membrane material provided in physical model 401, similar to physical model 301 of FIG. 3, in accordance with one embodiment of the present invention. FIG. 4 also illustrates the mechanics of the structure at the embossed location. As shown in FIG. 4, physical model 401, which has a thickness of $t_1$, generally, includes embossed location 203. Embossed location 203 is provided in membrane layer 406. The membrane material at embossed location 203, where it has a thickness $t_2$, covers an opening that results from removing backing material from physical model 401 at embossed location 203. By embossing membrane layer 406, the surface flatness of physical model 401 is preserved, such that, when a user surveys the exterior-facing side of physical model 401 with his/her finger, a user has the perception that the back side of the housing is intact and continuous. As indicated by arrows 404 and 405, pointing to the exterior-facing and interior-facing sides of physical model 401, respectively, the cavity of embossed location 403 opens to the interior of the cellular telephone. EMP actuator 402 is bonded to the membrane layer 406, at the inside surface in the cavity at embossed location 403. The thickness $t_2$ is specifically selected to provide a pre-determined haptic response magnitude when EMP actuator 402 is excited under expected use conditions. By providing the embossed membrane of membrane layer 406 at embossed location 403, the haptic response (e.g., a vibration) can be precisely designed using any of numerous membrane materials whose mechanical properties are well-known. A designer can select the best material among numerous choices for this purpose.

A housing for an electronic device in accordance with the teachings of this detailed description allows a haptic feedback response that is localized to a specific area on a back panel of a housing of the electronic device. For example, the present invention allows a user holding the electronic device to directly receive haptic feedback in his/her fingers that are supporting the electronic device from the back side. As described above, the specific areas on the back panel (e.g., thinned portions 103 and openings 302) may be locations where the panel material is thinned, or locations where the panel material has been removed and replaced, for example, by a suitably selected membrane material with favorable mechanical properties. The membrane material may be introduced as an embossment of a membrane layer, such as shown in FIG. 4. In addition, a force-sensing resistor type material may be used as the membrane material (e.g., membrane layer 406), so as to sense a pressure of a user's finger pressing on the embossed structure at the specific locations to which EMP actuators are bonded. The EMP actuators may create both audio and vibro-tactile signals when excited. The audio component gives the user an audible confirmation for a key that is pressed.

According to one embodiment of the present invention, one or more of the EMP actuators on the back panel in the housing of a portable mobile device (e.g., a cellular telephone) may be triggered when a user operates the mobile device using the touch sensors of a touch panel at the front side of the mobile device.

The EMP actuators discussed may be implemented using any of the devices, methods or materials disclosed in the Previous Provisional Application and the Copending Application.

The detailed description above is provided to illustrate specific embodiments of the present invention and is not intended to be limiting. Numerous variations and modifications within the scope of the present invention are possible.

We claim:

1. In a housing of an electronic device, a structure comprising:
   a dividing wall including a thinned portion of the structure, the dividing wall separating an interior space within the housing and an exterior space outside of the housing, and a cavity in connection with the interior space, the cavity being separated from the exterior space by the dividing wall; and
   an electromechanical polymer (EMP) actuator that is positioned within the cavity and in contact with the dividing wall such that when the EMP actuator is activated, a mechanical vibration is initiated in the dividing wall.

2. The structure of claim 1, further comprising a membrane lining the cavity, wherein the dividing wall is formed by a portion of the membrane.

3. The structure of claim 2, wherein the dividing wall comprises an embossed portion of the membrane.

4. The structure of claim 1, wherein a thickness of the dividing wall determines the magnitude of the mechanical vibration experienced at the dividing wall facing the exterior space.

5. The structure of claim 1, wherein the structure comprises a panel provided on a backside of the housing.

6. The structure of claim 1, further comprising a sensor positioned on a surface of the housing that faces the exterior space and wherein the EMP actuator is activated in response to a sensing signal received at the sensor.

7. The structure of claim 6, wherein the sensor and the EMP actuator are parts of an EMP transducer.

8. The structure of claim 6, wherein the sensor comprises a force-sensing resistor type material provided at the dividing wall.

9. The structure of claim 6, wherein the sensor is provided on a touch screen on a front side of the electronic device.

10. The structure of claim 1, wherein the mechanical vibration is audible.

11. A method comprising:
    providing in a housing of an electronic device a dividing wall having a thinned portion of a structure, the dividing wall separating an interior space within the housing and an exterior space outside of the housing, and a cavity in connection with the interior space, the cavity being separated from the exterior space by the dividing wall; and
    positioning an electromechanical polymer (EMP) actuator within the cavity and in contact with the dividing wall such that, when the EMP actuator is activated, a mechanical vibration is initiated in the dividing wall.

12. The method of claim 11, further comprising lining the cavity with a membrane, wherein the dividing wall is formed by a portion of the membrane.

13. The method of claim 12, wherein the dividing wall comprises an embossed portion of the membrane.

14. The method of claim 11, wherein a thickness of the dividing wall determines the magnitude of the mechanical vibration experienced at the dividing wall facing the exterior space.

15. The method of claim 11, wherein the structure comprises a panel provided on a backside of the housing.

16. The method of claim 11, further comprising positioning a sensor on a surface of the housing that faces the exterior space and wherein the EMP actuator is activated in response to a sensing signal received at the sensor.

17. The method of claim 16, wherein the sensor and the EMP actuator are parts of an EMP transducer.

18. The method of claim 16, wherein the sensor comprises a force-sensing resistor type material provided at the dividing wall.

19. The method of claim 16, wherein the sensor is provided on a touch screen on a front side of the electronic device.

20. The method of claim 11, wherein the mechanical vibration is audible.

* * * * *